United States Patent
Akeno et al.

(10) Patent No.: US 9,040,977 B2
(45) Date of Patent: May 26, 2015

(54) ORGANIC EL ELEMENT HAVING AT LEAST ONE ORGANIC LIGHT-EMITTING LAYERS FORMED OF A MIXTURE CONTAINING A POLYMER MATERIAL AND METHOD FOR MANUFACTURING THE ORGANIC EL ELEMENT

(75) Inventors: Yasutake Akeno, Tokyo (JP); Takuma Oouchi, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 14/347,360

(22) PCT Filed: Sep. 14, 2012

(86) PCT No.: PCT/JP2012/005917
§ 371 (c)(1),
(2), (4) Date: Apr. 29, 2014

(87) PCT Pub. No.: WO2013/046592
PCT Pub. Date: Apr. 4, 2013

(65) Prior Publication Data
US 2014/0231792 A1    Aug. 21, 2014

(30) Foreign Application Priority Data

Sep. 28, 2011 (JP) .................................. 2011-213175

(51) Int. Cl.
| | | |
|---|---|---|
| *H01L 29/08* | (2006.01) | |
| *H01L 35/24* | (2006.01) | |
| *H01L 51/40* | (2006.01) | |
| *H01L 51/50* | (2006.01) | |

(Continued)

(52) U.S. Cl.
CPC ............ *H01L 51/5012* (2013.01); *H05B 33/10* (2013.01); *H01L 51/0004* (2013.01); *H01L 51/5016* (2013.01); *H05B 33/14* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,582,504 B1 | 6/2003 | Fujita | |
| 2002/0106529 A1* | 8/2002 | Okunaka et al. | 428/690 |

(Continued)

FOREIGN PATENT DOCUMENTS

| | | |
|---|---|---|
| JP | 2001-155858 A | 6/2001 |
| JP | 2003-017248 A | 1/2003 |

(Continued)

*Primary Examiner* — Michael Jung
(74) *Attorney, Agent, or Firm* — Hammer & Associates, P.C.

(57) ABSTRACT

To form stabilized organic light-emitting medium layers using the relief printing method and to provide an organic EL element excellent in terms of pattern-forming accuracy, film thickness uniformity and light-emitting characteristics, a substrate 2, first electrode layers 3 provided on the substrate 2, organic light-emitting medium layers 5 which are provided on the first electrode layers 3 and emit light when electrically connected, and second electrodes 6 which are provided on the organic light-emitting medium layers 5 and make the organic light-emitting medium layers 5 electrically connected when voltage is applied between the first electrodes 3 and the second electrodes are provided. In addition, at least one of the organic light-emitting medium layers 5 is formed of a mixture containing a polymer material having a weight-average molecular weight in a range of 1.5 million to 25 million and at least one low molecular material having a non-repetitive structure. Also, the mixing ratio between the polymer material and the low molecular material is set in a range of 0.05:1 to 0.5:1 in terms of weight ratio.

7 Claims, 1 Drawing Sheet

(51) Int. Cl.
  *H05B 33/10* (2006.01)
  *H01L 51/00* (2006.01)
  *H05B 33/14* (2006.01)
  *H01L 51/56* (2006.01)
  *H01J 1/62* (2006.01)
  *H01J 63/04* (2006.01)
  *G09G 3/36* (2006.01)

(56) References Cited

U.S. PATENT DOCUMENTS

2003/0044645 A1* 3/2003 Kambe et al. ............ 428/690
2003/0178935 A1 9/2003 Nishimura et al.
2006/0257686 A1 11/2006 Shimizu et al.
2008/0233429 A1 9/2008 Oguma et al.
2008/0268137 A1 10/2008 Ikeda et al.

FOREIGN PATENT DOCUMENTS

| JP | 3541625 B2 | 7/2004 |
| JP | 2004-296226 A | 10/2004 |
| JP | 2005-272834 A | 10/2005 |
| JP | 2006-318781 A | 11/2006 |
| JP | 2008-291352 A | 12/2008 |
| JP | 2009-267299 A | 11/2009 |

* cited by examiner

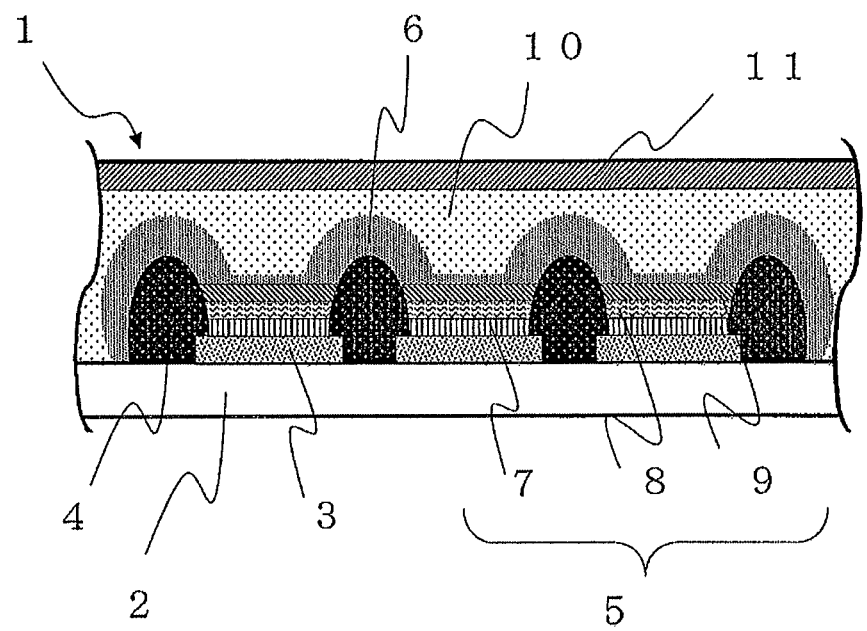
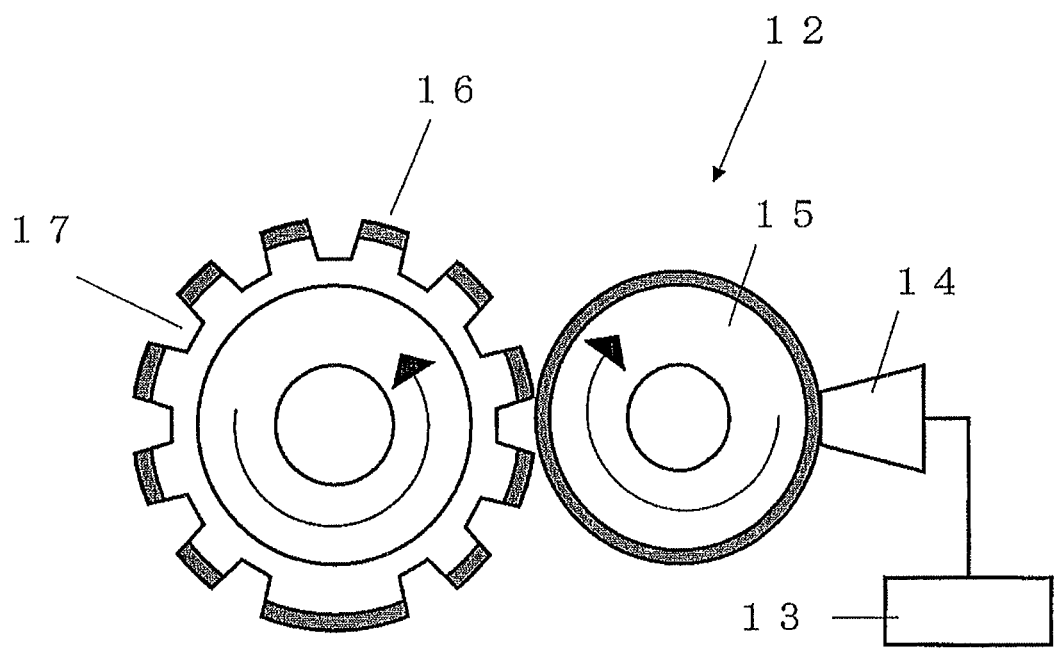

US 9,040,977 B2

ORGANIC EL ELEMENT HAVING AT LEAST ONE ORGANIC LIGHT-EMITTING LAYERS FORMED OF A MIXTURE CONTAINING A POLYMER MATERIAL AND METHOD FOR MANUFACTURING THE ORGANIC EL ELEMENT

TECHNICAL FIELD

The present invention relates to an organic EL element and a method for manufacturing an organic EL element.

BACKGROUND ART

In an organic electroluminescence (EL) element, when a current is made to flow in a conductive organic light-emitting layer, electrons and holes injected into the organic light-emitting layer are recombined, and an organic light-emitting material that constitutes the organic light-emitting layer is made to emit light during the recombination. To make a current flow in the organic light-emitting layer and draw light outside, a transparent electrode and an opposite electrode are provided on both sides of the organic light-emitting layer. More specifically, the organic EL element is generally configured by forming a transparent electrode layer on a transparent substrate, forming organic light-emitting medium layers on the transparent electrode layer, and forming an opposite electrode layer on the organic light-emitting medium layers, and the transparent electrode is used as a positive electrode, and the opposite electrode is used as a negative electrode.

The organic light-emitting medium layers are formed by stacking a plurality of laminate-structured layers, and the organic light-emitting layer made of an organic light-emitting material is included in the plurality of the laminate-structured layers. In addition, for example, a hole-transporting layer, a hole-injecting layer, an electron-transporting layer and the like are included.

Recently, the organic light-emitting layer and the hole-transporting layer in the organic light-emitting medium layer have been formed of a polymer material that has a large weight-average molecular weight and is easily dissolved in a solvent. Thus, the respective layers can be formed using a wet coating method such as a spin coating method or a printing method such as a relief printing method, a letterpress reverse offset printing method or an inkjet method in the atmosphere, and the reduction of manufacturing facility costs or the improvement of productivity can be achieved (see PTL 1 to 4). Particularly, the relief printing method using a photosensitive resin plate containing rubber or other resins as principal components can produce the high-definition patterning of organic light-emitting medium layers at a uniform film thickness in an excellent manner without causing damage to an object being transferred (refer to PTL 5). In addition, there is a method in which polystyrene or polyvinyl carbazole is used as a viscosity adjuster for the polymer material (refer to PTL 6).

CITATION LIST

Patent Literatures

PTL 1: JP 2003-17248A
PTL 2: JP 2004-296226A
PTL 3: Japanese Patent No. 3541625
PTL 4: JP 2009-267299A
PTL 5: JP 2001-155858A
PTL 6: JP 2006-318781A

SUMMARY OF INVENTION

Technical Problem

A low molecular material used for the organic light-emitting medium layers has light-emitting efficiency and a service life that are similar or superior to those of a polymer material, and there is a demand for replacing a polymer material with a low molecular material. However, there is a problem in that it is not possible to use a low molecular material in a method for manufacturing the organic EL element. This is because, when a low molecular material is made into ink, the ink has viscosity that is too low to be used in the relief printing method, and therefore the low molecular material is not suitable for the relief printing method.

To apply a low molecular material to the relief printing method, it is necessary to increase the viscosity of ink obtained by dissolving a low molecular material in a solvent. Although there is a method in which a high-boiling-point solvent having a high viscosity is used as a solvent, the range of available solvents is narrow, and the method is disadvantageous in terms of the solubility of a functional material. Furthermore, a thin film made of a low molecular material is unstable, and there is a case in which crystallization or agglomeration is caused due to heat generated during the operation of the organic EL element. Additionally, it is known that crystallization or agglomeration proceeds while the organic EL element is stored without being made to emit light.

In addition, even when polystyrene or polyvinyl carbazole is particularly used as a viscosity adjuster of a polymer material as a technique to use a viscosity adjuster, it is still difficult to ensure ink viscosity enough to apply a low molecular material to the relief printing method.

A subject of the present invention is to form stabilized organic light-emitting medium layers using the relief printing method and to provide an organic EL element excellent in pattern-forming accuracy, film thickness uniformity and light-emitting characteristics.

Solution to Problem

To solve the above-described problems, an organic EL element includes a substrate, first electrode layers provided on the substrate, organic light-emitting medium layers which are provided on the first electrode layers and emit light when electrically connected, and second electrodes which are provided on the organic light-emitting medium layers and make the organic light-emitting medium layers electrically connected when voltage is applied between the first electrodes and the second electrode, where at least one of the organic light-emitting medium layers is formed of a mixture containing a polymer material having a weight-average molecular weight in a range of 1.5 million to 25 million and at least one low molecular material having a non-repetitive structure.

In addition, the low molecular material is made of an organic light-emitting material.

In addition, a mixing ratio between the polymer material and the low molecular material is set in a range of 0.05:1 to 0.5:1 by mass ratio.

In addition, the polymer material is made of a non-conductive polymer.

A method for manufacturing an organic EL element includes providing first electrode layers on a substrate, providing organic light-emitting medium layers that emit light when electrically connected on the first electrode layers, providing second electrodes on the organic light-emitting medium layer which make the organic light-emitting medium layers electrically connected when voltage is applied between the first electrodes and the second electrodes, and forming at least one of the organic light-emitting medium layers by applying ink containing a polymer material having a weight-average molecular weight in a range of 1.5 million to 25 million and at least one low molecular material having a non-repetitive structure.

In addition, an organic light-emitting material is used for the low molecular material.

In addition, a concentration of the polymer material in the ink is set in a range of 0.05% by mass to 10% by mass.

In addition, a non-conductive polymer is used for the polymer material.

In addition, the ink is applied using a relief printing method.

Advantageous Effects of Invention

According to the present invention, due to the binding effect of the polymer material, it is possible to form stabilized organic light-emitting medium layers with no agglomeration of the material caused by heat generation that occurs during the operation of the organic EL element.

In addition, according to the method for manufacturing an organic EL element, since the ink containing a low molecular material and a polymer material having a weight-average molecular weight in a range of 1.5 million to 25 million is used, it is possible to manufacture an organic EL element that is excellent in pattern-forming accuracy, film thickness uniformity and light-emitting characteristics using the relief printing method.

BRIEF DESCRIPTION OF DRAWINGS

FIG. 1 is a cross-sectional view illustrating a configuration of an organic EL element; and FIG. 2 is a schematic view illustrating a printer apparatus.

DESCRIPTION OF EMBODIMENTS

Hereinafter, embodiments of the present invention will be described with reference to the drawings.

An organic EL element 1 of the present embodiment is an example of an organic EL element having a so-called passive matrix structure. The organic EL element 1 includes a transparent substrate 2, a plurality of positive electrodes 3 (pixel electrode layers) formed on one surface of the transparent substrate 2, partition walls 4 that partition the respective positive electrodes 3, organic light-emitting medium layers 5 stacked on the positive electrodes 3, and negative electrodes 6 (opposite electrode layers) that are stacked on the organic light-emitting medium layers 5 and are disposed opposite to the positive electrodes 3.

The transparent substrate 2 is a substrate that supports the positive electrodes 3, the organic light-emitting medium layers 5 and the negative electrodes 6, and is made of a glass substrate or a plastic film or sheet. Examples of the plastic film that can be used include polyethylene terephthalate films, polypropylene films, cycloolefin polymer films, polyamide films, polyether sulfone films, polymethyl methacrylate films and polycarbonate films.

Meanwhile, another gas barrier film such as a ceramic-deposited film, a polyvinylidene chloride film, a polyvinyl chloride film or a saponified ethylene-vinyl acetate copolymer film may be stacked on the other surface (the bottom surface in FIG. 1) of the transparent substrate 2 on which the positive electrodes 3 are not formed. In the case of a bottom emission-type organic EL element, it is necessary to use a transparent substrate; however, in the case of a top emission-type organic EL element, it is not always necessary to use a transparent substrate.

The positive electrodes 3 constitute first electrodes. The positive electrodes 3 are formed in a strip shape at regular intervals on the transparent substrate 2, and have a layer thickness in a range of 0.05 μm to 0.2 μm. In addition, in the case of the bottom emission-type organic EL element, the positive electrodes 3 are formed of a conductive material that is transparent in the visible light range such as indium tin oxide (ITO). The positive electrodes 3 are formed by forming a film on a surface of the transparent substrate 2 through deposition or using a sputtering method, and then etching the film using a mask having a predetermined hole shape.

Meanwhile, for the positive electrodes 3, it is possible to use indium zinc oxide (IZO), a metallic composite oxide such as zinc composite oxide or zinc aluminum composite oxide, tin oxide ($SnO_2$), zinc oxide (ZnO), indium oxide ($In_2O_3$) or the like as well as ITO. In addition, the positive electrodes may be formed using an application and thermal decomposition method in which a precursor such as indium octylate or indium acetylacetone is applied to the transparent substrate 2, and then an oxide is formed through thermal decomposition.

The partition walls 4 are formed on parts of the transparent substrate 2 located between the adjacent positive electrodes 3 to prevent the organic light-emitting medium layers 5 formed on the respective positive electrodes 3 from being mixed together, and have a height of, for example, 2 μm. In addition, the partition walls 4 are formed away from the circumferential edge portions of the positive electrodes 3. Additionally, the partition walls 4 are constituted of a positive or negative-type photosensitive resin, and are formed by applying a photosensitive resin to the transparent substrate 2 using an application method such as a spin coater, a bar coater, a roll coater, a die coater or a gravure coater, and then patterning the resin in a predetermined shape using a photolithography technique. Here, examples of the photosensitive resin that is applicable to the partition walls 4 include polyimide-based resins, acryl resins, novolac resins and the like.

The organic light-emitting medium layer 5 is formed using a single-layer film containing an organic light-emitting material or by stacking a plurality of laminate-structured layers. For example, in a case in which the organic light-emitting medium layer is formed by stacking a plurality of laminate-structured layers, a hole-transporting layer 7, an organic light-emitting layer 8, an electron-transporting layer 9 are included. Meanwhile, the configuration of the organic light-emitting medium layer 5 in the organic EL element according to the present embodiment is not limited to the configuration illustrated in the drawing, and the organic light-emitting medium layer may employ other configurations. It is also possible to separate a hole or electron injection function as necessary or to insert a layer or the like that blocks the transportation of holes or electrons. Meanwhile, the organic light-emitting medium layer 5 of the present embodiment refers to a layer containing an organic light-emitting material.

In the present embodiment, since at least one of the layers that constitute the organic light-emitting medium layer 5 is formed of a mixture containing a polymer material having a weight-average molecular weight in a range of 1.5 million to 25 million and at least one low molecular material not having a repetitive structure, an organic EL element excellent in terms of pattern-forming accuracy, film thickness uniformity and light-emitting characteristics can be obtained. In addition, the low molecular material is more preferably an organic light-emitting material. Here, the low molecular material refers to a material having a weight-average molecular weight in a range of 100 to 3000, and the weight-average molecular weight of the low molecular material is preferably in the above-described range, but the weight-average molecular weight is not necessarily in the above-described range as long as the low molecular material does not have a repetitive structure.

In a specific example illustrated in FIG. 1, the organic light-emitting medium layer 5 includes three layers of the hole-transporting layer 7, the organic light-emitting layer 8, and the electron-transporting layer 9. In addition, the thicknesses of the respective layers are not fixed, but are preferably in a range of 10 nm to 100 nm, and more preferably in a range of 30 nm to 100 nm.

Here, the polymer material used for the organic light-emitting medium layer 5 is preferably a polymer material that does not react with the low molecular material being mixed together and has a weight-average molecular weight preferably in a range of 1.5 million to 25 million, and more preferably in a range of 1.5 million to 10 million. The polymer material may be a mixture of polymers having different weight-average molecular weights, and, in a case in which polymers having different weight-average molecular weights are mixed, a polymer having a weight-average molecular weight outside the above-described range may be mixed, but the mixture desirably contains at least one polymer material having a weight-average molecular weight in the above-described range. When the weight-average molecular weight of the polymer material is less than 1.5 million, the viscosity of the ink is not sufficient in a case in which the ink is applied using the relief printing method, and there is a case in which film defects, variation and the like are caused during the formation of a film such that a stabilized organic light-emitting medium layer 5 cannot be formed. On the other hand, in a case in which the weight-average molecular weight is greater than 25 million, there is a case in which the viscosity of the ink becomes too high such that it is not possible to apply the ink using the relief printing method or a case in which the film thickness becomes too thick such that the conductivity of the organic light-emitting medium layer 5 decreases and the light-emitting efficiency decreases.

In addition, the mixing ratio between the polymer material and the low molecular material is preferably in a range of 0.05:1 to 0.5:1 (polymer material:low molecular material) in terms of weight ratio. In a case in which the mixing ratio is in the above-described range, the agglomeration of the low molecular material is prevented due to the binding effect of the polymer, and a stabilized organic light-emitting medium layer 5 can be formed. When the weight ratio becomes less than 0.05:1, since the agglomeration of the low molecular material occurs, it becomes impossible to uniformly form the organic light-emitting medium layer 5, and, when the weight ratio becomes larger than 0.5:1, the film thickness becomes too thick such that the light-emitting efficient decreases. Meanwhile, the weight of the low molecular material in the above-described ratio indicates the total weight of a host material and the above-described doped material.

Furthermore, a non-conductive polymer is preferably used for the polymer material. Examples thereof include polystyrene, PMMA, polycarbonate and the like. In a case in which a conductive polymer is used, carriers are preferentially injected into the conductive polymer, and move into the organic light-emitting medium layer without contributing to the low molecular material such that the light-emitting efficiency decreases. However, when a non-conductive polymer is used, carriers are preferentially injected into the low molecular material, and therefore it is possible to improve the light-emitting efficiency.

Meanwhile, the non-conductive material stated herein refers to a material having a carrier mobility of less than $10^{-7}$ cm$^2$/Vs, and a polymer having a carrier mobility of less than $10^{-7}$ cm$^2$/Vs is preferably used as the non-conductive polymer. However, since it is still possible to obtain the above-described effect when a polymer having a carrier mobility smaller than the carrier mobility of the low molecular material is used, when having a carrier mobility smaller than that of the low molecular material, a polymer having a carrier mobility of $10^{-7}$ cm$^2$/Vs or more may be used.

As the solvent used for the ink that forms the organic light-emitting medium layer 5, a single solvent such as toluene, xylene, mesitylene, cumene, anisole, methylanisole, para-cymene, tetralin, cyclohexylbenzene, methyl naphthalene, cyclohexanone, cyclohexylbenzene, methyl benzoate, ethyl benzoate, water, ethanol, acetone, methyl ethyl ketone, methylisobutyl ketone, methanol, isopropyl alcohol, ethyl acetate or butyl acetate; or a solvent mixture thereof can be used.

Meanwhile, the concentration of the polymer material contained in the ink that forms the organic light-emitting medium layer 5 needs to be in a range of 0.05% by weight to 10% by weight, and is preferably in a range of 0.3% by weight to 3% by weight. As described above, when the concentration is set in a range of 0.05% by weight to 10% by weight, it is possible to transfer a pattern at a uniform film thickness with favorable precision using the relief printing method without causing the dripping of the ink.

At least one of the organic light-emitting medium layers 5 of the present embodiment is formed using the relief printing method. The ink viscosity of the organic light-emitting medium layer is preferably in a range of 2 mPa·s to 120 mPa·s. In a case in which the ink viscosity is less than 2 mPa·s, the ink attaches to unnecessary portions due to the fluidity of the ink such that the unevenness or repellence-caused variation of the film thickness is caused. In addition, in a case in which the ink viscosity is higher than 120 mPa·s, the unevenness or variation of the film thickness is caused due to the lack of the leveling of the ink. As other forming methods, depending on a material being used, it is possible to use a wet method such as spin coating, bar coating, wire coating, slit coating, spray coating, curtain coating, flow coating, letterpress reverse offset printing or an inkjet method or a deposition method such as a resistance heating deposition method, an electron beam deposition method, a reactive deposition method, an ion plating method or a sputtering method.

The hole-transporting layer 7 has a function that moves holes injected from the positive electrode 3 toward the negative electrode 6 and prevents electrons from moving toward the positive electrode 3 while running holes.

A hole-transporting material used for the hole-transporting layer 7 can be selected from, for example, metal phthalocyanines such as copper phthalocyanine and tetra(t-butyl) copper phthalocyanine; non-metal phthalocyanines; aromatic amine-based low molecular hole-injecting and transporting materials such as quinacridone compounds, 1,1-bis(4-di-p-torylaminophenyl)cyclohexane, N,N'-diphenyl-N,N'-bis(3-methylphenyl)-1,1'-biphenyl-4,4'-diamine and N,N'-di(1-naphtyl)-N,N'-diphenyl-1,1'-biphenyl-4,4'-diamine; polymer hole-transporting materials such as polyaniline, polythiophene, polyvinyl carbazole and mixtures of poly(3, 4-ethylene dioxythiophene) and polystyrene sulfonate; polythiophene oligomer materials; inorganic materials such as $Cu_2O$, $Cr_2O_3$, $Mn_2O_3$, $FeO_x$ (x to 0.1), NiO, CoO, $Pr_2O_3$, $Ag_2O$, $MoO_2$, $Bi_2O_3$, ZnO, $TiO_2$, $SnO_2$, $ThO_2$, $V_2O_5$, $Nb_2O_5$, $Ta_2O_5$, $MoO_3$, $WO_3$ and $MnO_2$; and other existing hole-transporting materials.

The organic light-emitting layer 8 is a functional material that emits light of any color of red, green or blue when voltage is applied to the organic light-emitting layer. As a low molecular material used for the organic light-emitting layer 8, it is possible to use, for example, 9,10-diarylanthracene derivative, pyrene, coronene, perylene, rubrene, 1,1,4,4-tetraphenyl butadiene, tris(8-quinolate) aluminum complex, tris (4-methyl-8-quinolate) aluminum complex, bis(8-quinolate) zinc complex, tris(4-methyl-5-trifluoromethyl-8-quinolate) aluminum complex, tris(4-methyl-5-cyano-8-quinolate) aluminum complex, bis(2-methyl-5-trifluoromethyl-8-quinolinolate) [4-(4-cyanophenyl)phenolate]aluminum complex, bis(2-methyl-5-cyano-8-quinolinolate) [4-(4-cyanophenyl)phenolate] aluminum complex, tris(8-quinolylate) scandium complex, bis[8-p-tosyl]aminoquinoline]zinc complex or cadminum complex, 1,2,3,4-tetraphenyl cyclopentadiene, poly-2,5-diheptyloxy-p-phenylenevinylene, or the like. Particularly, as a low molecular light-emitting material used for pixels that emit red light, it is possible to use 2,2',2"-(1,3,5-benzenetriyl)tris(1-phenyl-1H-benzimidazole) (TPBi) as a host material and to use tris(2-(p-toryl)pyridine)iridium (III) (Ir(mppy)3) as a doped material.

As an electron-transporting material used for the electron-transporting layer 9, it is possible to use 2-(4-biphenylyl)-5-(4-t-butylphenyl)-1,3,4-oxadiazole, 2,5-bis(1-naphtyl)-1,3,4-oxadiazole, an oxadiazole derivative, bis(10-hydroxybenzo[h]quinolinolate) beryllium complex, a triazole compound or the like. In addition, an electron-injecting layer may be produced by doping a small amount of an alkali metal or an alkali rare earth metal having a low work function, such as sodium, barium or lithium, to the electron-transporting material.

The negative electrodes 6 are, similarly to the positive electrodes 3, formed on the organic light-emitting medium layers 5 in a strip shape at regular intervals with the longitudinal direction in a direction orthogonal to the longitudinal direction of the positive electrodes 3 when viewed on a plane. A metallic single body such as lithium, magnesium, calcium, ytterbium or aluminum, or an alloy or multilayered body of the above-described metal and a stable metal such as gold or silver is used for the negative electrode 6 depending on the light-emitting characteristics of the organic light-emitting layer. In addition, it is also possible to use a conductive oxide such as indium, zinc or tin. The above-described materials are formed using ordinary vacuum deposition, such as resistance heating or EB heating, a sputtering method, or the like.

Thus far, a case in which the positive electrodes are disposed on the transparent substrate 2 side has been described, but the present embodiment may have a configuration in which the negative electrodes are disposed on the transparent substrate 2 side as the first electrodes.

(Manufacturing Method)

Next, a method for manufacturing the organic EL element 1 having the above-described configuration will be described.

First, the positive electrodes 3 which are the first electrodes are formed on the transparent substrate 2. That is, an ITO film is formed using a sputtering method throughout the entire surface of the transparent substrate 2, furthermore, exposed and developed using a photolithography technique, necessary portions left as the positive electrodes 3 are coated with a photoresist, and unnecessary portions are etched using a ferric chloride solution so as to remove the ITO film. Then, strip-shaped positive electrodes 3 disposed at predetermined intervals are formed.

Next, the partition walls 4 are formed between the respective positive electrodes 3. That is, a photoresist is applied to the transparent substrate 2 or the positive electrodes 3, exposed and developed using a photolithography technique, thereby leaving the photoresist between the respective positive electrodes 3. After that, the photoresist is cured through baking.

After that, using a relief printing apparatus 12 illustrated in FIG. 2, the organic light-emitting medium layers 5 are formed on the positive electrodes 3. As described above, ink produced by mixing the polymer material and the low molecular material is used for at least one layer that forms the organic light-emitting medium layers 5. The relief printing apparatus 12 includes an ink tank 13 in which the ink mixture is stored, an ink chamber 14 to which the ink is supplied, an anilox roll 15, and a plate cylinder 17 having relief printing plates 16 provided on the surface.

In addition, the ink is supplied to the ink chamber 14 from the ink tank 13 in which the ink mixture is stored, and the ink is applied to the surface of the anilox roll 15. Next, the ink applied to the surface of the anilox roll 15 is transferred to the relief printing plates 16, and the ink is transferred to the positive electrodes 3.

Subsequently, the negative electrodes 6 are deposited and formed on the organic light-emitting medium layers 5 using a deposition method such as a resistance heating and deposition method. Finally, to protect the positive electrodes 3, the organic light-emitting medium layers 5 and the negative electrodes 6 from oxygen or moisture in the air, a resin layer 10 is filled, coated and sealed with a sealing substrate 11, thereby manufacturing the organic EL element 1.

(Actions and Effects)

According to the organic EL element 1 and the method for manufacturing the organic EL element 1 configured as described above, it becomes possible to use a low molecular material using a printing method, and to stabilize the organic light-emitting medium layers without decreasing the light-emitting efficiency.

The above-described configuration has been described for the organic EL element having a passive matrix structure, but it can also be configured as an organic EL element having a so-called active matrix structure. In the case of the active matrix structure, the positive electrodes 3 are formed as pixel electrode layers that are partitioned using partition walls by pixel, and the electron-transporting layers 9 and the negative electrodes 6 form the opposite electrode layers formed throughout the entire surface of the element. In addition, since the partition walls that partition pixels allow each pixel to occupy as large an area as possible, the partition walls are formed in a lattice shape in which the edge portions of the pixel electrode layers are covered and the respective pixel electrode layers are partitioned at a shortest distance.

EXAMPLES

Hereinafter, the invention will be described in detail using examples and comparative examples.

Example 1

As illustrated in FIG. 1, a 0.7 mm-thick 100 mm×100 mm square glass plate was used as the transparent substrate 2, and strip-shaped positive electrodes 3 having a width of 80 µm and a thickness of 0.15 µm were formed at intervals of 120 µm. Here, the surface roughness Ra of the positive electrode 3 became 20 nm in an arbitrary 150 µm$^2$ plane. In addition, the partition wall 4 has a width between the bottom edges that are in contact with the transparent substrate 2 of 30 µm, a width between the top edges of 5 µm, a height of 1 µm, and a cross-sectional that is substantially trapezoidal.

Here, the partition walls 4 were formed through development using a photolithography technique and then 60-minute baking at approximately 150° C. In addition, the hole-transporting layers 7 were formed by dissolving a polyarylene derivative as a hole-transporting material in xylene so as to obtain a dispersion fluid having a concentration of 0.5% by weight, applying the dispersion fluid using a spin coating method, and drying the dispersion fluid.

For the organic light-emitting layers 8, as a low molecular light-emitting material used for pixels that emit green light, 2,2',2"-(1,3,5-benzenetriyl)tris(1-phenyl-1H-benzimidazole) (TPBi) was used as a host material, and tris(2-(p-toryl)pyridine)iridium (III) (Ir(mppy)3) was used as a doped material. The low molecular light-emitting material was mixed with polystyrene as the non-conductive polymer material. The mixed weight ratio of polystyrene, TPBi and Ir(mppy)3 in an organic light-emitting ink was 0.20:0.94:0.06 (polystyrene:TPBi:Ir(mppy)3), that is, the mixing ratio between the non-conductive polymer material and the low molecular light-emitting material is 0.20:1.0. The weight-average molecular weight of the polystyrene (manufactured by Sigma-Aldrich Co., LLC.) is 1.8 million.

Next, 2% by weight ink obtained by dissolving the mixture of the non-conductive polymer material and the low molecular light-emitting material in anisole was applied on the hole-transporting layers 7 using the relief printing method. At this time, a 600 lines/inch anilox roll and a photosensitive resin plate corresponding to the pixel pitch was used. After that, the ink was dried at 150° C. for 30 minutes in an inert gas atmosphere, thereby obtaining a 70 nm-thick organic light-emitting layer 8. Finally, LiF:Al=0.5 nm:150 nm was formed as the negative electrodes through deposition. After that, a sealing substrate was attached, thereby obtaining an organic EL element 1.

As a result of applying voltage between the positive electrodes 3 and the negative electrodes 6 in the organic EL element 1 manufactured in the above manner, uniform light emission with efficiency of 30 cd/A and chromaticity of (0.33, 0.62) was obtained.

The film thickness of the organic light-emitting layers 8 in the element was measured, and the variation value $3\sigma$ of the film thickness in a case in which a $3\sigma$ method, which is an ordinary statistic method, was used and $\sigma$ was used as the standard deviation was 10 nm.

Example 2

An organic EL element 1 was manufactured under the same conditions as in Example 1 except for the fact that the polymer material was formed of polystyrene having a weight-average molecular weight of 10 million (manufactured by Polysciences, Inc.). As a result of applying voltage between the positive electrodes 3 and the negative electrodes 6, uniform light emission with efficiency of 30 cd/A and chromaticity of (0.33, 0.62) was obtained.

As a result of measuring the film thickness of the organic light-emitting layers 8 in the element, the variation value $3\sigma$ of the film thickness was 10 nm.

Example 3

An organic EL element 1 was manufactured under the same conditions as in Example 1 except for the fact that the polymer material was formed of polystyrene having a weight-average molecular weight of 20 million (manufactured by Polysciences, Inc.). As a result of applying voltage between the positive electrodes 3 and the negative electrodes 6, uniform light emission with efficiency of 20 cd/A and chromaticity of (0.33, 0.62) was obtained.

As a result of measuring the film thickness of the organic light-emitting layers 8 in the element, the variation value $3\sigma$ of the film thickness was 13 nm.

Example 4

An organic EL element 1 was manufactured under the same conditions as in Example 1 except for the fact that the mixed weight ratio of polystyrene, TPBi and Ir(mppy)3 in the organic light-emitting ink was set to 0.08:0.94:0.06 (polystyrene:TPBi:Ir(mppy)3), that is, the mixing ratio between the non-conductive polymer material and the low molecular light-emitting material was set to 0.08:1.0. As a result of applying voltage between the positive electrodes 3 and the negative electrodes 6, uniform light emission with efficiency of 30 cd/A and chromaticity of (0.33, 0.62) was obtained.

As a result of measuring the film thickness of the organic light-emitting layers 8 in the element, the variation value $3\sigma$ of the film thickness was 12 nm.

Example 5

An organic EL element 1 was manufactured under the same conditions as in Example 1 except for the fact that the mixed weight ratio of polystyrene, TPBi and Ir(mppy)3 in the organic light-emitting ink was set to 0.46:0.94:0.06 (polystyrene:TPBi:Ir(mppy)3), that is, the mixing ratio between the non-conductive polymer material and the low molecular light-emitting material was set to 0.46:1.0. As a result of applying voltage between the positive electrodes 3 and the negative electrodes 6, uniform light emission with efficiency of 30 cd/A and chromaticity of (0.33, 0.62) was obtained.

As a result of measuring the film thickness of the organic light-emitting layers 8 in the element, the variation value $3\sigma$ of the film thickness was 11 nm.

Comparative Example 1

As a result of forming the organic light-emitting layers 8 under the same conditions as in Example 1 except for the fact that the ink was formed of the low molecular material only without mixing the polymer material, the line pattern became too wide, and the ink protruded into adjacent pixels. In addition, the maximum film thickness that could be obtained was approximately 20 nm.

Next, the electron-transporting layers 9 and the positive electrodes 3 were provided, thereby producing an organic EL element 1. As a result of applying voltage between the positive electrodes 3 and the negative electrodes 6 in the organic EL element 1, light was emitted at 5 V, but the efficiency remained at approximately 40 cd/m$^2$, or the light emission was immediately shut. Also, light was unevenly emitted.

As a result of measuring the film thickness of the organic light-emitting layers 8 in the element, the $3\sigma$ value was as great as 20 nm, and a significant film thickness difference was confirmed.

Comparative Example 2

As a result of forming the organic light-emitting layers 8 under the same conditions as in Example 1 except for the fact that the polymer material was formed of polystyrene having a weight-average molecular weight of 1 million (manufactured by Sigma-Aldrich Co., LLC.), the protrusion into adjacent pixels was not observed, but the linearity of the line pattern was poor.

Next, the electron-transporting layers 9 and the positive electrodes 3 were provided, thereby producing an organic EL element 1. As a result of applying voltage between the positive electrodes 3 and the negative electrodes 6 in the organic EL element 1, variation in light emission occurred.

As a result of measuring the film thickness of the organic light-emitting layers 8 in the element, the 3σ value was as great as 20 nm, and a significant film thickness difference was confirmed.

Comparative Example 3

As a result of forming the organic light-emitting layers 8 under the same conditions as in Example 1 except for the fact that the polymer material was formed of polystyrene having a weight-average molecular weight of 30 million (manufactured by Polysciences, Inc.), it was not possible to obtain the linearity of the line pattern.

Comparative Example 4

As a result of forming the organic light-emitting layers 8 under the same conditions as in Example 1 except for the fact that the mixed weight ratio of polystyrene, TPBi and Ir(mppy)3 in the organic light-emitting ink was set to 0.85:0.94:0.06 (polystyrene:TPBi:Ir(mppy)3, that is, the mixing ratio between the non-conductive polymer material and the low molecular light-emitting material was set to 0.85:1.0, it was not possible to obtain the linearity of the line pattern.

Industrial Applicability

According to the invention, it is possible to form organic light-emitting medium layers using a low molecular material and the relief printing method and to provide an organic EL element that is excellent in terms of pattern-forming accuracy, film thickness uniformity and light-emitting characteristics.

The invention claimed is:

1. An organic EL element comprising:
   a substrate;
   first electrode layers provided on the substrate;
   organic light-emitting medium layers provided on the first electrode layers and emitting light when electrically connected; and
   second electrodes provided on the organic light-emitting medium layers to make the organic light-emitting medium layers electrically connected when voltage is applied between the first electrodes and the second electrodes,
   wherein at least one of the organic light-emitting medium layers is formed of a mixture containing a non-conductive polymer material having a weight-average molecular weight in a range of 1.5 million to 25 million and at least one low molecular material having a non-repetitive structure and having a weight-average molecular weight in a range of 100 to 3000.

2. The organic EL element according to claim 1, wherein the low molecular material is made of an organic light-emitting material.

3. The organic EL element according to claim 1, wherein a mixing ratio between the polymer material and the low molecular material is set in a range of 0.05:1 to 0.5:1 in terms of weight ratio.

4. A method for manufacturing an organic EL element comprising:
   providing first electrode layers on a substrate;
   providing organic light-emitting medium layers emitting light when electrically connected on the first electrode layers;
   providing second electrodes on the organic light-emitting medium layers to make the organic light-emitting medium layers electrically connected when voltage is applied between the first electrodes and the second electrodes; and
   forming at least one of the organic light-emitting medium layers by applying ink containing a non-conductive polymer material having a weight-average molecular weight in a range of 1.5 million to 25 million and at least one low molecular material having a non-repetitive structure and having a weight-average molecular weight in a range of 100 to 3000.

5. The method for manufacturing an organic EL element according to claim 4, wherein an organic light-emitting material is used for the low molecular material.

6. The method for manufacturing an organic EL element according to claim 4, wherein a concentration of the polymer material in the ink is set in a range of 0.05% by weight to 10% by weight.

7. The method for manufacturing an organic EL element according to claim 4, wherein the ink is applied using a relief printing method.

* * * * *